(12) United States Patent
Tsay (10) Patent No.: US 6,184,054 B1
(45) Date of Patent: Feb. 6, 2001

(54) OPTICAL ELECTRONIC IC CAPABLE OF PHOTO DETECTION AND ITS PROCESS

(75) Inventor: Wen-Chin Tsay, Hsinchu (TW)

(73) Assignee: Miracle Technology Co., Ltd., Hsinchu (TW)

( * ) Notice: Under 35 U.S.C. 154(b), the term of this patent shall be extended for 0 days.

(21) Appl. No.: 09/200,483

(22) Filed: Nov. 27, 1998

Related U.S. Application Data (62) Division of application No. 09/106,126, filed on Jun. 29, 1998, now Pat. No. 5,990,490.

(51) Int. Cl.[7] .................................................. H01L 21/329
(52) U.S. Cl. ................................ 438/57; 438/237; 438/98
(58) Field of Search ..................................... 438/48, 91, 56, 438/57, 69, 92, 96, 98, 110, 116, 237, 328

(56) References Cited

U.S. PATENT DOCUMENTS

| | | | |
|---|---|---|---|
| 4,435,610 | * | 3/1984 | Perlman .................. 136/255 |
| 5,225,359 | * | 7/1993 | DeLong .................. 438/328 |
| 5,281,542 | * | 2/1990 | Hui et al. .................. 438/98 |
| 5,461,246 | * | 10/1995 | Chou .................. 257/459 |
| 5,468,673 | * | 11/1995 | Le Roux et al. .................. 438/328 |
| 5,494,833 | * | 2/1996 | Martin et al. .................. 438/92 |
| 5,631,490 | * | 5/1997 | Dutta et al. .................. 257/457 |
| 5,639,673 | * | 7/1997 | Vaccaro et al. .................. 438/92 |
| 5,712,197 | * | 1/1998 | Sanders et al. .................. 438/110 |
| 5,716,880 | * | 2/1998 | Verma .................. 438/237 |
| 5,739,065 | * | 4/1998 | Lin .................. 438/96 |
| 5,852,322 | * | 12/1998 | Speckbacher .................. 257/459 |
| 5,854,100 | * | 12/1998 | Chi .................. 438/57 |
| 5,963,788 | * | 10/1999 | Barron et al. .................. 438/57 |
| 5,996,162 | * | 11/1999 | Burghartz et al. .................. 430/57 |
| 6,007,667 | * | 12/1999 | Caitoh et al. .................. 438/57 |
| 6,017,775 | * | 1/2000 | Igel et al. .................. 438/48 |
| 6,033,232 | * | 3/2000 | Lin et al. .................. 438/237 |

* cited by examiner

*Primary Examiner*—Savitri Mulpuri
(74) *Attorney, Agent, or Firm*—Rosenberg, Klein & Lee (57) ABSTRACT

An optical-electronic integrated circuit combining photo detection with an integrated circuit is provided where a light signal input thereto can be directly translated into an electronic signal. The electronic signal can be received and processed by the same integrated circuit. For this optical-electronic integrated circuit, the photo detection circuit is made by a process—a current is generated when the photo detection circuit is impinged by photons.

2 Claims, 10 Drawing Sheets

30 The first electrode

40 The second electrode

FIG. 9

Si-Substrate

OPTICAL ELECTRONIC IC CAPABLE OF PHOTO DETECTION AND ITS PROCESS

This application is a division of Ser. No. 09/106,126 filed Jun. 29, 1998 now U.S. Pat. No. 5,990,490.

FIELD OF THE INVENTION

The present invention relates to an optical-electronic integrated circuit capable of translating the input light signal into an electronic signal.

BACKGROUND OF THE INVENTION

Communication using an optical fiber has prospered in the recent years. It is very important to construct optical-fiber network systems for future communication requirements. Mainly because the use of optical signals has several advantages, such as being instantaneous, increased precision and a wider range of frequency. The demand for the optical-electronic integrated circuits is increasing.

There are two kinds of photo detectors for receiving the incident light signal in the field of communication:

(1) compound semiconductor photo detectors; and, (2) silicon photo detectors.

The compound semiconductor photo detector is well studied in the academic research and in its application in the field of the industrial development. It is, however, more expensive than that of silicon photo detector from the viewpoint of cost. Moreover, the process of making the compound semiconductor photo detector is not compatible with the integrated circuit processing. Therefore, it becomes unrealistic to produce such an integrated circuit with the capability of detecting a light signal. Thus, the cost of manufacturing this kind of integrated circuit is high and its application is also limited for the same reason.

There are three types of silicon photo detectors:

(a) APD (avalanche photo diode);

(b) pin photo diode; and, (c) metal-semiconductor photo diode.

Figure 1A:
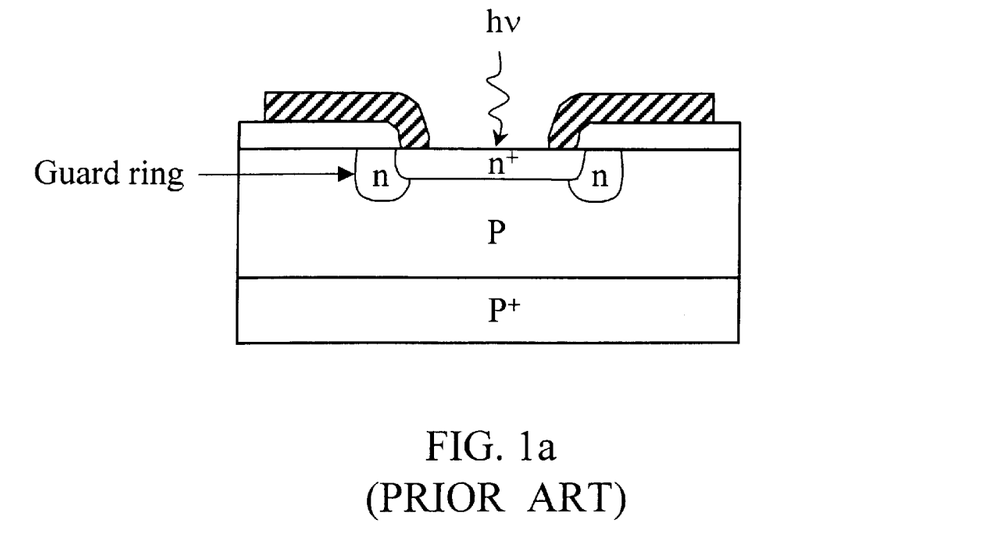
FIG. 1 is the conventional structure of "silicon-APD"
Figure 1B:
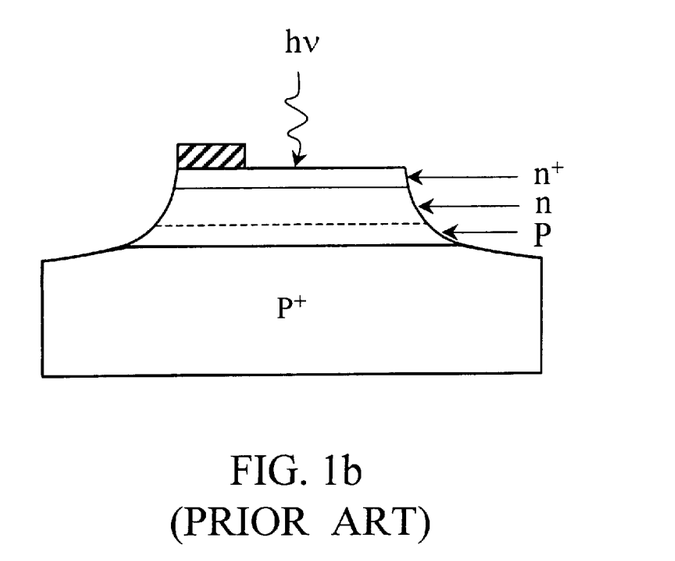
Figure 2:
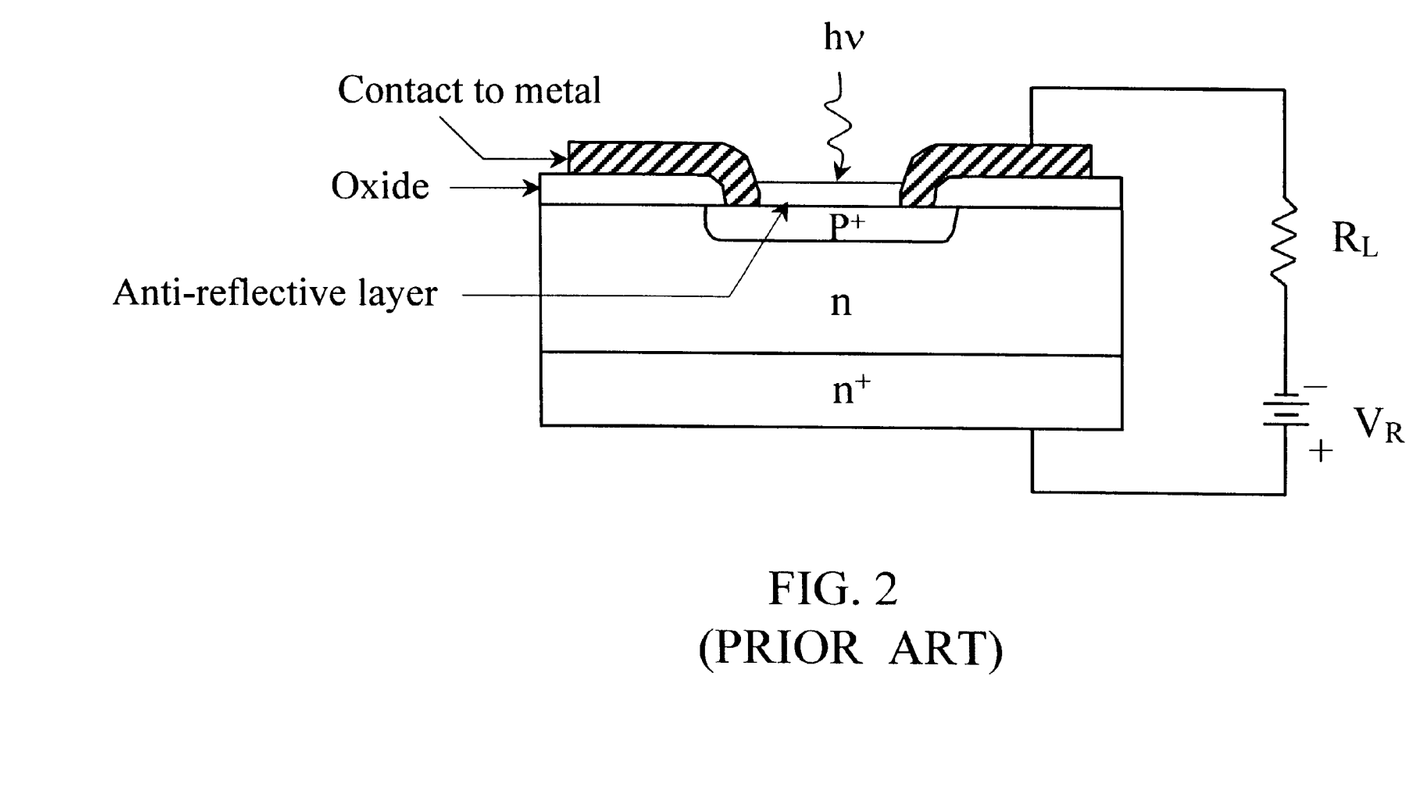
FIG. 2 is the conventional structure of "pin photo diode"
Figure 3:
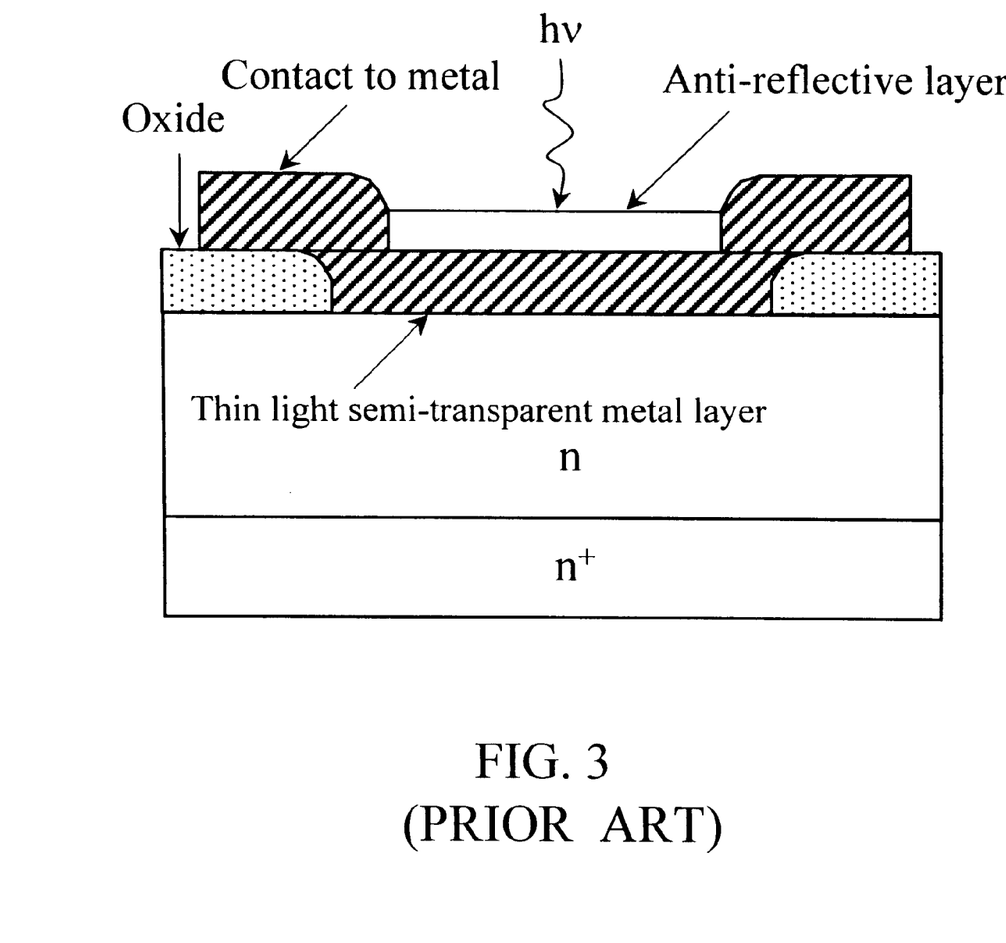
FIG. 3 is the conventional structure of "metal-semiconductor photo diode"

The first type of silicon photo detector is shown in the FIG. 1. The "Si-APD" is usually sued for optical communication over short distances. Its advantages are a shorter response time and a smaller light receiving area, but the shortcomings are high cost and a noisy signal. The second type of photo detector is shown in FIG. 2. The "pin photo diode" is usually used for remote controls, memory reading, and facsimile optical communications. Its cost is lower but the light receiving area is larger. The third type of photo detector is shown in the FIG. 3. The "metal-semiconductor photo diode" is usually used for detecting ultra-violet and visible light. The greatest disadvantage for this type of photo detector is that the thickness of the metal layer has to be thin and transparent to incident light.

Figure 4:
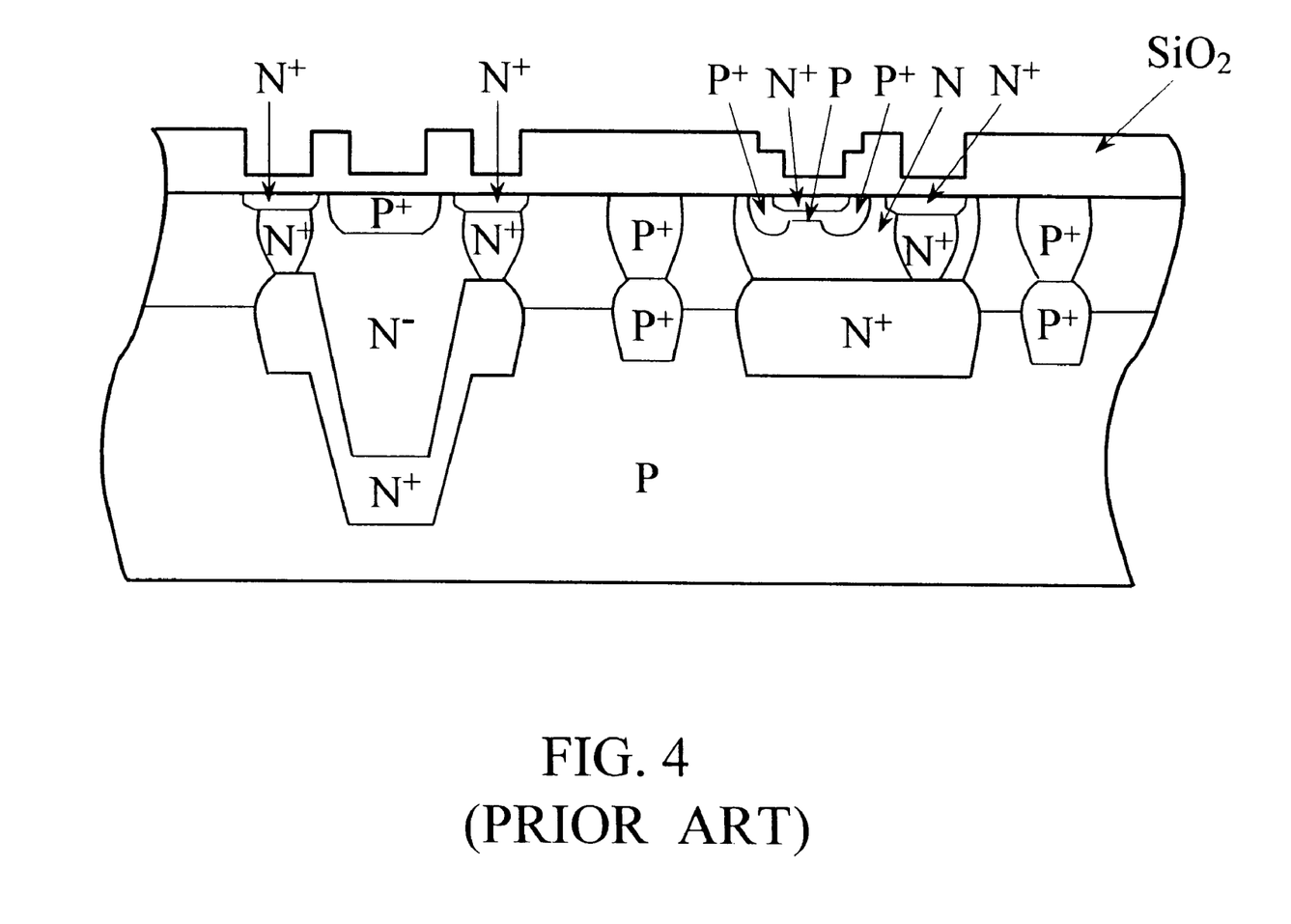
FIG. 4 and FIG. 5 are the structures of "Si-OEIC" proposed by Motohiki Yamamoto et al.
Figure 5:
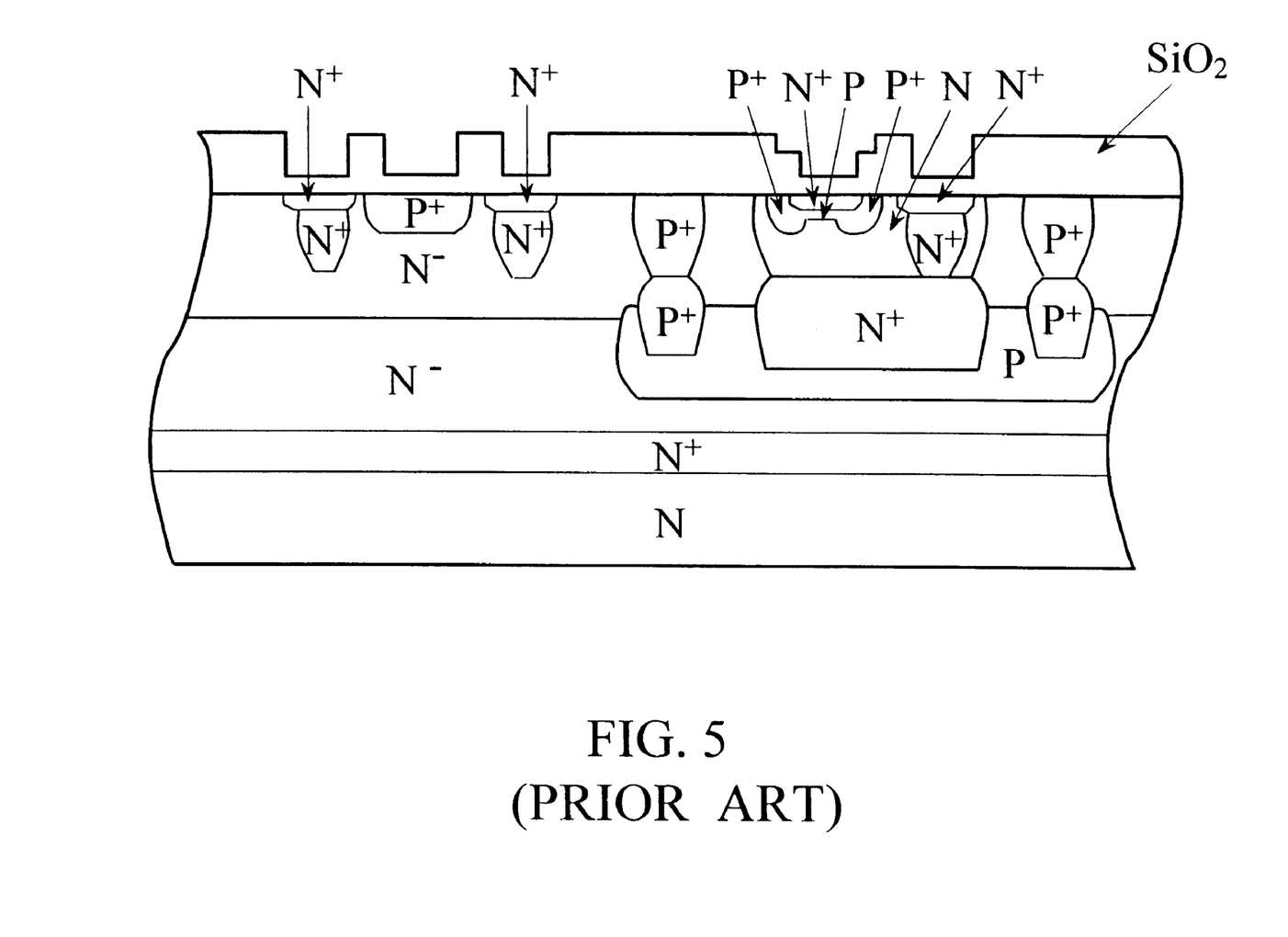

There is always some limitation on the wavelength to be detected for all types of photo detectors being used. And the integration for the "Si-OEIC", i.e., optical-electronic integrated circuit, is quite complex and difficult. As shown in the FIG. 4 and FIG. 5, the "Si-OEIC" structure is proposed by Motohiki Yamamoto et al. and is published in the IEEE Transactions on Electron Device, Vol. 142, No. 1, pp. 58–63, 1995. From those figures, the process for the manufacturing this kind of product is quite complex and the cost is also high.

Therefore, this invention incorporates modifications from the results of studying the "Metal-Semiconductor-Metal photo diode", as applied to the optical-electronic integrated circuit, and is such that the integration of "OEIC" can be achieved. Not only can the cost of production be reduced, but also the materials for the appropriate wavelength can be selected for manufacturing an optical-electronic integrated circuit of a "metal-semiconductor-metal photo diode".

SUMMARY OF THE INVENTION

This invention is directed to an optical-electronic integrated circuit, especially, for an integrated circuit that combines photo detection in an integrated circuit structure. The input light signal can be directly translated into an electronic signal using a photo detector of this invention and the electronic signal generated thereby can be received and processed by the same integrated circuit. The cost of producing the photo detector integrated circuit can be reduced greatly by combining the photo detection function with that of the integrated circuit. The wavelength range can be widely extended by appropriate selection of the materials for the photo detection integrated circuit.

DETAILED DESCRIPTION OF PREFERRED EMBODIMENTS

FIG. 6a, FIG. 6b, FIG. 7a and FIG. 7b show top views and cross-sectional views of two embodiments of photo detection circuits of the present invention, respectively. Those figures can be viewed as the photo diode of the semiconductor device. Either one of two metal layers can be used as the first layer of metal 10(10'). The first metal layer 10(10') is used as the first electrode, and then the photo detection semiconductor material, such as amorphous silicon, etc., is deposited. The layer of photo detection semiconductor film 90 is thus formed. Then, another layer of metal is used as the second layer of metal 20(20'). The second metal layer 20(20') is used as the second electrode. The appropriate voltage is applied between the two electrodes in order to deplete the layer of photo detection semiconductor film 90 completely. In this state, when the layer of photo detection semiconductor film 90 is hit by photons, a photo-current will be produced, and thus the light signal will be translated into an electronic signal.

Figure 6A:
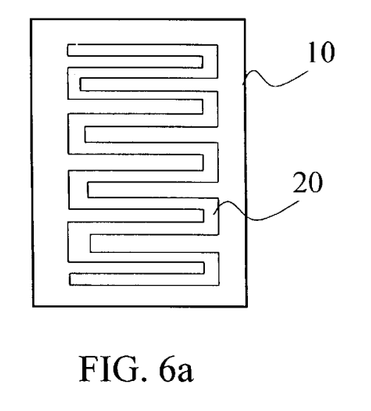
FIG. 6a and FIG. 6b are the top views of two embodiments of photo detector structure of the present invention.
Figure 6B:
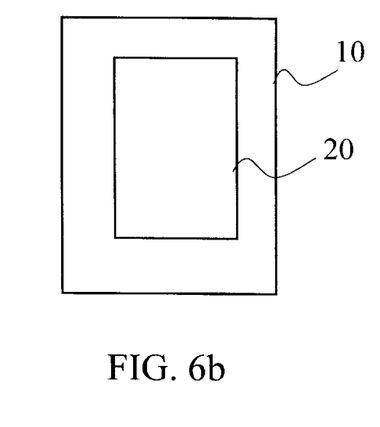
Figure 7A:
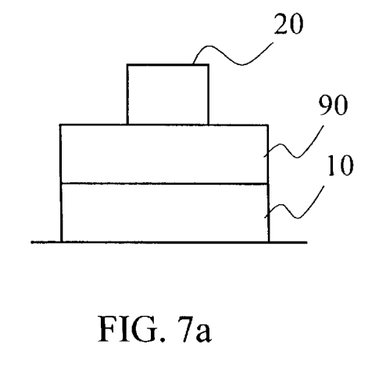
FIG. 7a and FIG. 7b are the cross sectional views showing the photo detector structure of the present invention (the same as FIG. 6a and FIG. 6b).
Figure 7B:
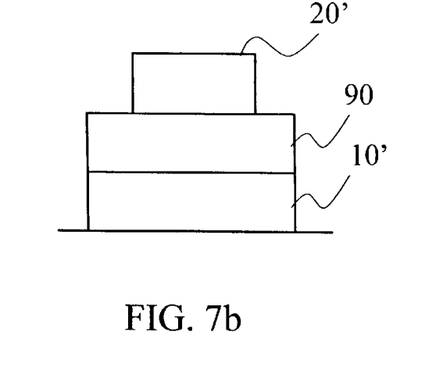
Figure 8:
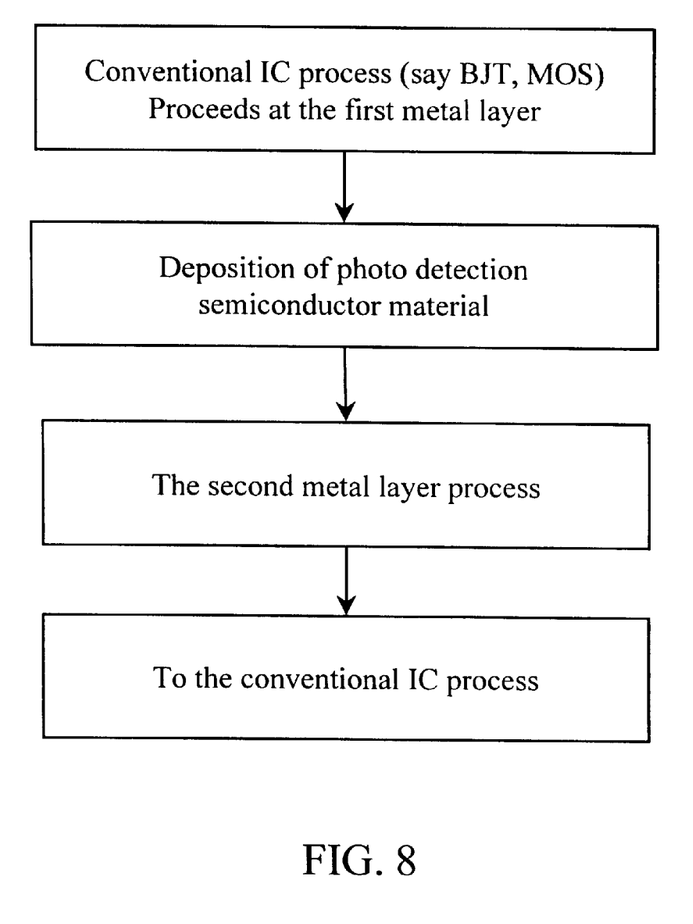
FIG. 8 is a block diagram of the process flow for the photo detector integrated circuit of the present invention.

FIG. 8 shows a process flow chart of the aforementioned structure. The initial steps are the same as the conventional process for manufacturing the integrated circuits. But following the step of forming the first metal layer 10(10'), is the process of forming the photo detection circuit. First, the photo detection semiconductor film 90 is deposited, then it is followed by conventional integrated circuit processes, such as the photolithography and etching processes. Then the second metal layer 20(20') is deposited. Conventional integrated circuit processes follow the second metal layer deposition. The requirement for the latter metal film process deposited on the photo detection circuit is that light should substantially penetrate through the deposited material, in order that the operation of the photo detector not be affected by the quality of the deposited film. At the same time, if the photo detection circuit of FIG. 6*b* is used then the material for the second layer of metal 20(20') should be transparent to the incident light, for the same reason as previously described. Certainly, the light transparent material is good for the efficiency of optical-electronic translating, but is not necessary for the embodiment of the present invention shown in FIG. 6*a*.

Figure 9:
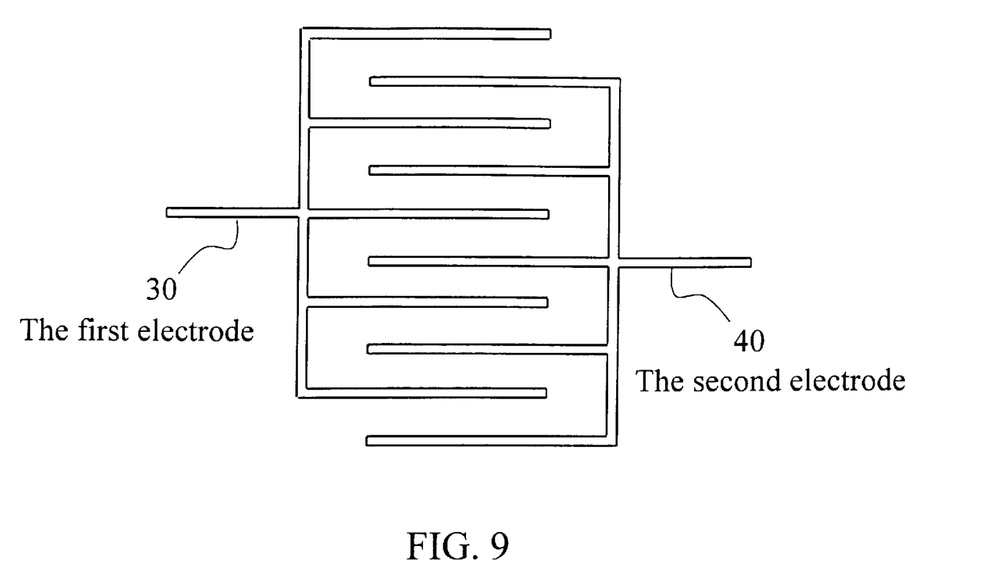
FIG. 9 is a schematic top view of the electrodes for another embodiment of the photo detector integrated circuit of the present invention.
Figure 10:
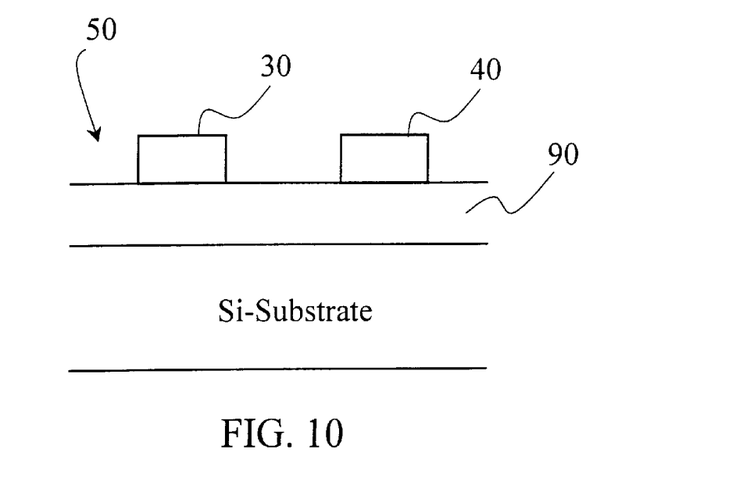
FIG. 10 is a cross-sectional view of the photo detector integrated circuit of FIG. 9.
Figure 11A:
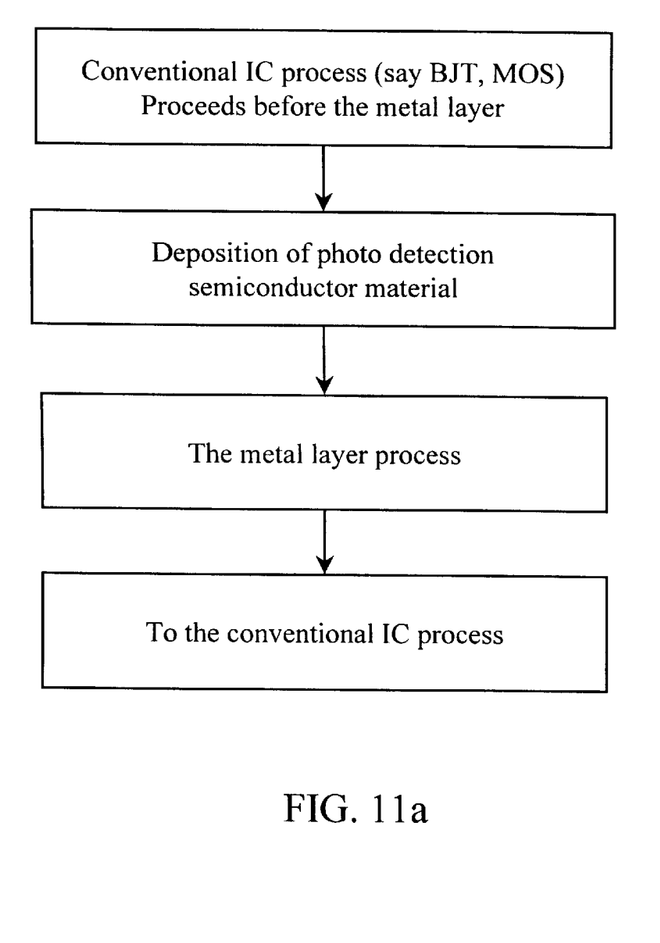
FIG. 11a and FIG. 11b are embodiments of the process flow of the photo detector integrated circuit for the embodiment of FIG. 10.
Figure 11B:
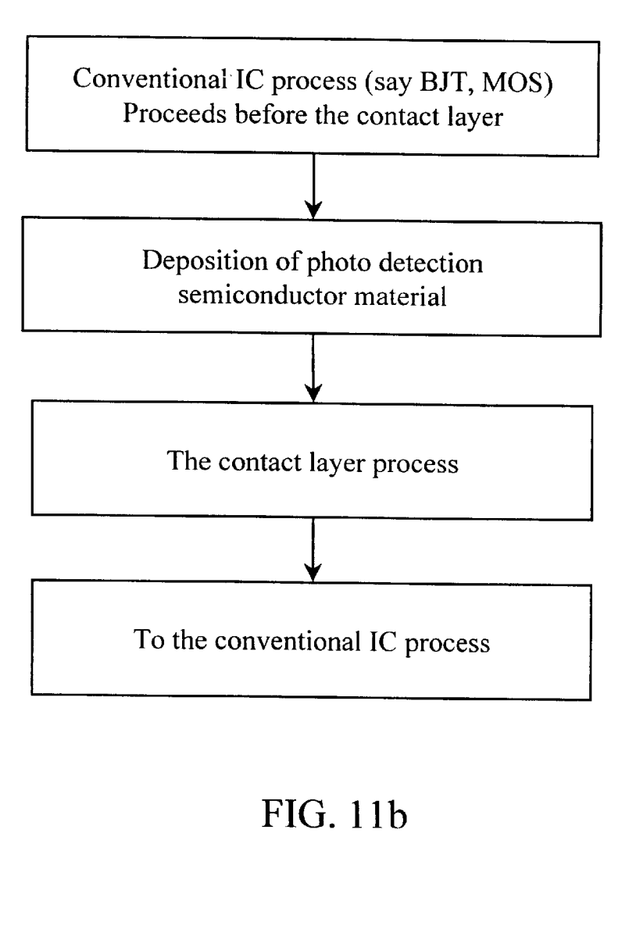

As shown in FIGS. 9 to 11*a* and FIG. 11*b*, another embodiment of the present invention is represented that is different from the two previously described embodiments. The process of the latter example uses planar processes for forming the photo detection circuit. The first electrode 30 corresponding to the first metal layer 10(10'), described previously, and the second electrode 40 corresponding to the second metal layer 20(20'), are made at the same time in one metal layer 50, as shown in the cross-sectional view of FIG. 10. Moreover, the shape of the electrode is a finger-type structure, as shown in FIG. 9, for increasing the electric field and the efficiency of operation (different shapes are also acceptable for the electrode, such as line, square, circle and a multi-edge shape). The process is similar to that of the conventional bipolar junction transistor (BJT) IC or metal-oxide-semiconductor (MOS) IC except that the orientation of the photo detection circuit should be reserved. When the process proceeds to the contact step, before the deposition of metal film as shown in the FIG. 11*a*, the semiconductor material for the photo detection layer is then deposited. The photo detection semiconductor thin film 90 is formed and is followed by photolithography and the etching process. The metal film is deposited after the photo detection circuit is processed. The metal film layer can be a conventional one, as in normal IC processing, or one that is highly transparent to incident light such as ITO (indium tin oxide), etc. The other way of processing is to deposit the photo detection semiconductor thin film 90 first and then the contact processing follows, as shown in the FIG. 11*b*.

Figure 12:
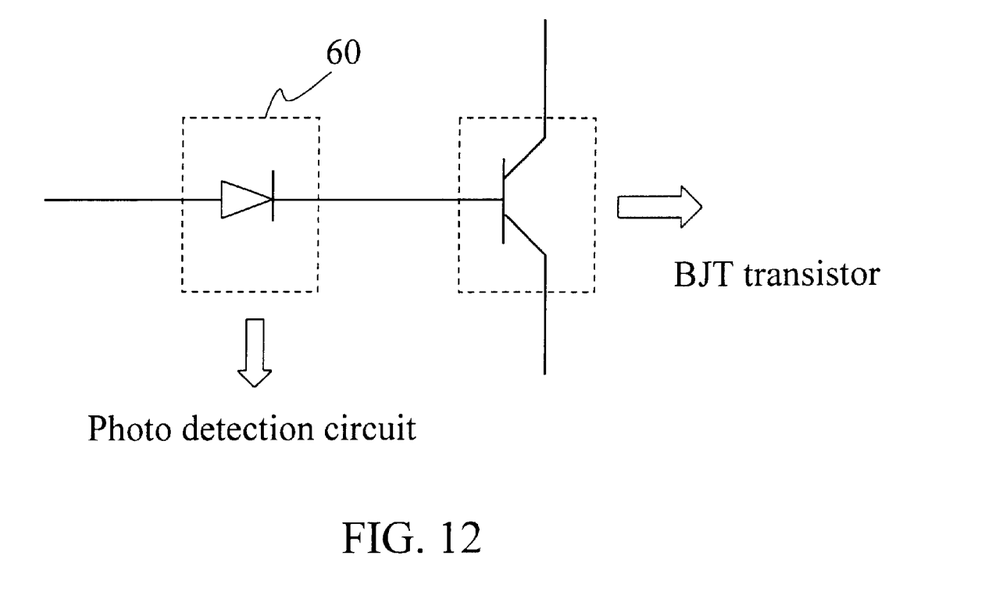
FIG. 12 is a schematic of an integrated circuit of the present invention.
Figure 13:
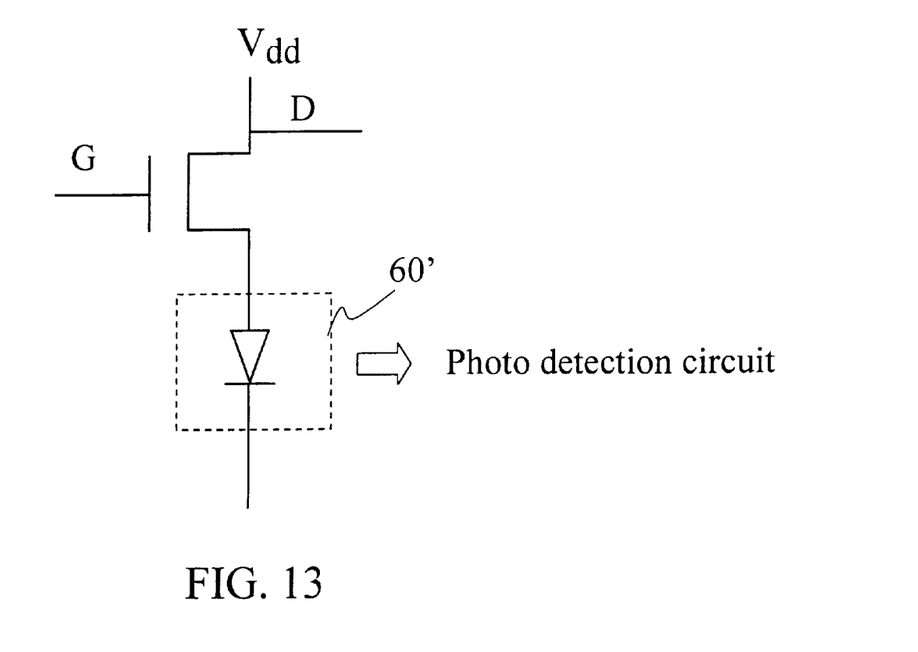
FIG. 13 is a schematic of another embodiment of an integrated circuit of the present invention.

FIG. 12 and FIG. 13 show a basic circuit that can be used in the present invention. As shown in the FIG. 12, when the photo detector 60 is impinged by a photon, the current will be injected into the base of BJT transistor and translated into the electronic signal. FIG. 13 shows that when the photo detector 60' receives the light signal and the circuit is connected, the MOS device is turned on. Thus, the light signal is translated into the electronic signal. The previously described two processes are the available methods, but any feasible methods can be used for the present invention.

The deposition of the semiconductor thin film 90 for the photo detection layer can be selected according to the need for response at various wavelengths. Several different light receiving materials can be used for the same purpose such as amorphous silicon, silicon carbide (SiC), silicon germanium (SiGe), gallium arsenide (GaAs), indium phosphide (InP), or gallium aluminum arsenide (GaAlAs), etc.

What is claimed is:

1. A method of fabricating an optical-electronic integrated circuit for generating a current responsive to a light signal incident thereon comprising the steps of:

(a) establishing on a substrate a semiconductor transistor device;

(b) forming adjacent said semiconductor transistor device a first metal layer by depositing a material substantially transparent to the incident light signal;

(c) forming a photo detection semiconductor film by depositing on said first metal layer a material containing a component selected from the group consisting of: amorphous silicon, amorphous germanium, silicon germanium, silicon carbide, gallium arsenide, indium phosphide, and gallium aluminum arsenide;

(d) forming a second metal layer upon said photo detection semiconductor film by metallization, wherein at least one of said first and second metal layers defines an undulating pattern; and, (e) coupling at least one of said first and second metal layers to said semiconductor transistor device, whereby said photo detection semiconductor film is depleted responsive to the application of a predetermined potential across said first and second metal layers.

2. A method of fabricating an optical-electronic integrated circuit for photo detection of a light signal incident thereto comprising the steps of:

(a) establishing an integrated circuit including a semiconductor transistor device formed on a substrate;

(b) depositing on said substrate of said integrated circuit a photo detection semiconductor film for receiving the light signal, said photo detection semiconductor film containing a material selected from the group consisting of: amorphous silicon, amorphous germanium, silicon germanium, silicon carbide, gallium arsenide, indium phosphide and gallium aluminum arsenide; and, (c) forming a metal layer on said photo detection semiconductor film, said metal layer defining a pair of interdigitated electrodes disposed on a common plane; and, (d) coupling at least one of said pair of electrodes to said semiconductor transistor device, whereby said photo detection semiconductor film is depleted responsive to the application of a predetermined potential across said pair of electrodes.

* * * * *